United States Patent [19]

Lyyra

[11] Patent Number: 4,775,830
[45] Date of Patent: Oct. 4, 1988

[54] METHOD OF AND ARRANGEMENT FOR MEASURING LOW CAPACITANCES

[75] Inventor: Matti Lyyra, Vantaa, Finland

[73] Assignee: Vaisala Oy, Finland

[21] Appl. No.: 930,580

[22] Filed: Nov. 13, 1986

Related U.S. Application Data

[63] Continuation-in-part of Ser. No. 739,326, May 30, 1985, abandoned.

[30] Foreign Application Priority Data

May 31, 1984 [FI] Finland .................................. 842192

[51] Int. Cl.$^4$ ............................................ G01R 27/26
[52] U.S. Cl. .............................. 324/61 R; 324/60 CD
[58] Field of Search ............. 324/61 R, 60 C, 60 CD, 324/60 R; 377/56, 112, 114

[56] References Cited

U.S. PATENT DOCUMENTS

| | | | |
|---|---|---|---|
| 3,012,193 | 12/1961 | Breen | 324/61 R |
| 4,187,460 | 2/1980 | Dauge et al. | 324/60 CD |
| 4,339,709 | 7/1982 | Brihier | 324/61 R |

FOREIGN PATENT DOCUMENTS

WO84/01220  3/1984  PCT Int'l Appl. .............. 324/61 R

Primary Examiner—J. R. Scott
Assistant Examiner—Morris Ginsburg
Attorney, Agent, or Firm—Steinberg & Raskin

[57] ABSTRACT

Method of and arrangement for measuring low capacitances include generating a periodic frequency signal having time periods of duration dependent on capacitance, and alternately connecting an unknown capacitance to be measured and a known reference capacitance, one after the other, to a frequency generator for an equal number of time periods of the frequency signal. Each time period has a first and a second time interval proportional to the reference capacitance and the unknown capacitance, respectively. A DC voltage output signal proportional to the unknown capacitance being measured is generated in response to the durations of the first and second time intervals. The DC voltage output signal is preferably scaled, linearized and temperature compensated.

24 Claims, 2 Drawing Sheets

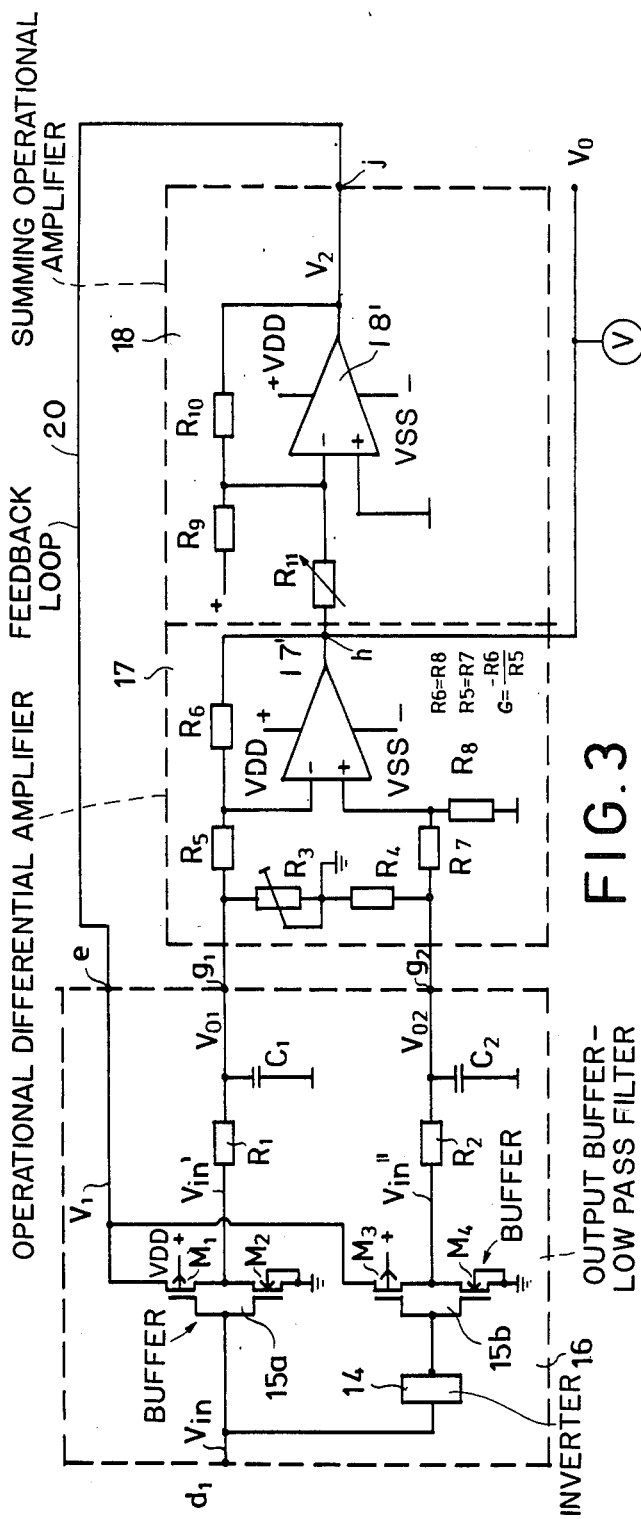
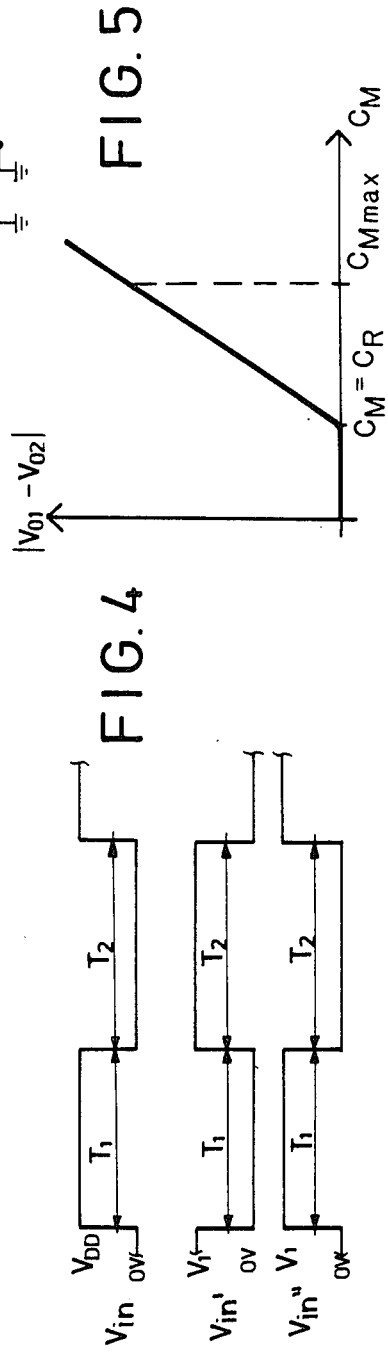

METHOD OF AND ARRANGEMENT FOR MEASURING LOW CAPACITANCES

CROSS-REFERENCE TO RELATED APPLICATION

This application is a continuation-in-part of pending application Ser. No. 739,326 filed May 30, 1985, now abandoned.

BACKGROUND OF THE INVENTION

1. Field of the Invention

The present invention generally relates to a method of and arrangement for measuring capacitances and, more particularly, for measuring low capacitances by alternately switching a reference capacitance and an unkown capacitance to be measured across the input terminals of a measurement oscillator operative for generating an output frequency proportional to the capacitance connected to the oscillator.

2. Description of the Related Art

One starting point for the present invention is the prior art technology disclosed, for example, in Finnish Pat. Nos. 54,664 and 57,319, corresponding to U.S. Pat. Nos. 4,295,090 and 4,295,091, respectively. These patents disclosed a method of and arrangement for measuring low capacitances.

In transducers, capacitive detectors were used for the measurement of various parameters, in particular, pressure, temperature and humidity. The magnitude of the capacitance of the capacitive detectors depended upon the parameter being measured. The capacitances of these detectors were often relatively low, from a few pF to some dozens pF, up to a maximum of about 100 pF. The measurement of low capacitances was erratic, due, for example, to stray capacitances, variations in supply voltage, ambient temperature, and other disturbances. Furthermore, the capacitive detectors were to some extent individual, so that they had unique non-linearity and temperature-dependent characteristics.

In telemeter applications, in particular, when temperature, humidity or pressure, for example, was measured by electric or electromechanical detectors, it was common to connect one or several known reference capacitances to a measurement circuit, the references being highly stable, so that errors of the measurement circuit and/or of the detector could be eliminated.

It was known in the prior art to alternately connect a known reference capacitance and an unknown capacitance to be measured to the input terminals of the measurement circuit. The measurement circuit usually included an RC-oscillator which generated an output frequency. The corresponding output variable of the reference capacitance of the measurement circuit was brought to a correct level by appropriate adjustment of the measurement circuit, or in some other manner.

It was also known in the prior art to use measurement circuits having one reference, in particular, bridge circuits in which the measurement was precise only when the electrical value of the reference was close to the value of the detector, for example, when the bridge circuit was in equilibrium. The greater the difference in value between the detector and the reference, the greater were the various errors, for example, errors caused by changes in the dynamics of the electronic measurement circuit. An advantage of bridge circuits employing one reference was the simplicity of the overall measurement circuit.

An advantage in measurement arrangements with two or more references was accuracy of the measurement, even within wide ranges of measurement. However, the complexity of the measurement method and of the related computation was a serious drawback.

SUMMARY OF THE INVENTION

1. Objects of the Invention

An object of the invention is to improve the accuracy and precision of prior art methods and circuits for measuring low capacitances on the order of 0 pF to 100 pF.

Another object of the invention is to reduce, if not eliminate, the effects of switching phenomena, zero shift and temperature sensitivity on the measurement of low capacitances.

Still another object of the invention is to generate an appropriately linearized, compensated and scaled DC voltage output signal which is proportional, preferably directly linearly, to the low capacitance value being measured.

Another object of the invention is to provide for temperature compensation during the capacitance measurement.

2. Features of the Invention

In order to achieve the aforementioned objects and other objects which will become apparent hereinafter, one feature of this invention comprises alternately connecting an unknown capacitance to be measured and a reference capacitance, one after the other, to input terminals of a measurement oscillator for an equal number of cycles of the measurement oscillator; and for generating, in response to such alternate connections, a DC voltage output signal proportional to the capacitance being measured.

The measurement oscillator generates an output frequency signal which is preferably divided by an asynchronous or synchronous frequency divider. The frequency divider generates a square wave output signal which is used to control analog switches which, in turn, control the alternate connection of the capacitance to be measured and the reference capacitance.

In a preferred embodiment of the invention, the square wave output signal of the frequency divider also controls data-out buffers, one of the operating voltage terminals of which has been brought out separately and serves as a control terminal. By adjusting the magnitude of a control voltage applied to the control terminal, the amplitudes of the square wave output signals supplied by the data-out buffers can be rectified, filtered and adjusted and used for linearization, compensation and scaling, as required.

In accordance with the invention, a simple temperature compensation may be provided by appropriately selecting a positive or negative temperature coefficient of a parallel capacitance of the measurement oscillator. The effects of the switching phenomena may be reduced, if not eliminated, if the division ratio N of the frequency divider is sufficiently high, i.e. N being greater than 10.

BRIEF DESCRIPTION OF THE DRAWINGS

For a fuller understanding of the invention, reference is had to the following description, taken in connection with the accompanying drawings, in which:

FIG. 3 is a block diagram of another embodiment of the invention;

FIG. 4 is a graphical representation of various waveforms appearing at different points in FIG. 3; and FIG. 5 is a graphical representation of the output voltage generated by the measurement circuit as a function of the capacitance to be measured.

DETAILED DESCRIPTION OF THE PREFERRED EMBODIMENTS

Figure 1:
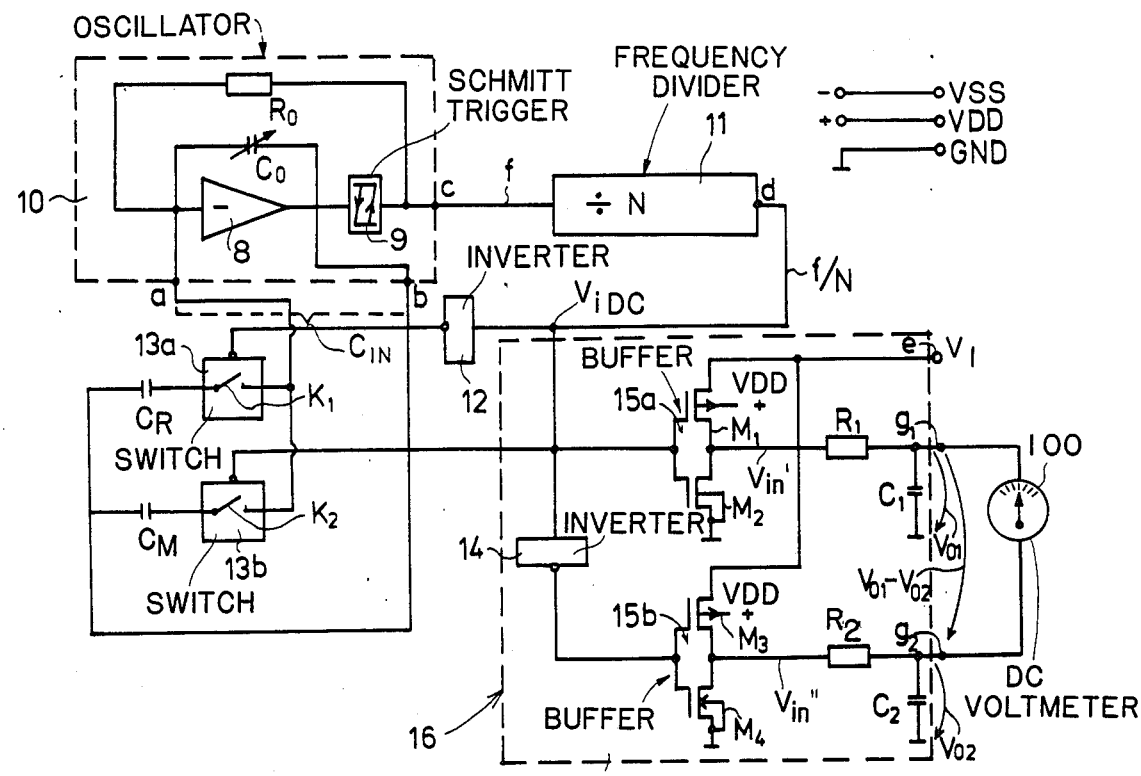
FIG. 1 is a block diagram of an embodiment of a measurement circuit according to the invention for undertaking the method of the invention.

FIG. 1 depicts a circuit arrangement for carrying out the method of the invention by utilization of an oscillator sub-circuit 10. In accordance with the invention, an unknown capacitance $C_M$ to be measured and a known, highly stable reference capacitance $C_R$ are alternately connected to and across input terminals a and b of the oscillator 10. A known capacitance $C_O$ is connected in parallel across the input terminals a and b of the oscillator 10. As described below, either the reference capacitance $C_R$ or the capacitance $C_M$ to be measured is connected in parallel with the capacitance $C_O$. A Schmitt trigger 9 is connected between input terminal b and an output terminal c of the oscillator. A resistor $R_o$ is connected between input terminal a and output terminal c. An amplifier 8 between terminals a and b is of the inverting type.

An output frequency signal f is generated by the measurement oscillator 10 as an output variable. The frequency signal f is a function of the value of the total capacitance (either $C_M$ in parallel with $C_o$, or $C_R$ in parallel with $C_o$) connected across the input terminals a and b of the oscillator. If $C_{in}$ is the general description for $C_R$ or $C_M$, then it can be shown that:

$$f = F(C_{IN}) \tag{1}$$

$$f = \frac{A}{B(C_o + C_{IN}) + \tau} \tag{2}$$

wherein

A and B are known constants, and $\tau$ is a known time constant.

The inverting amplifier 8 has a high input impedance, a high gain, and a low dynamic output impedance which minimizes the effect of stray capacitances on measurement accuracy. The high gain minimizes input voltage level variations at the input of amplifier 8.

Figure 2:
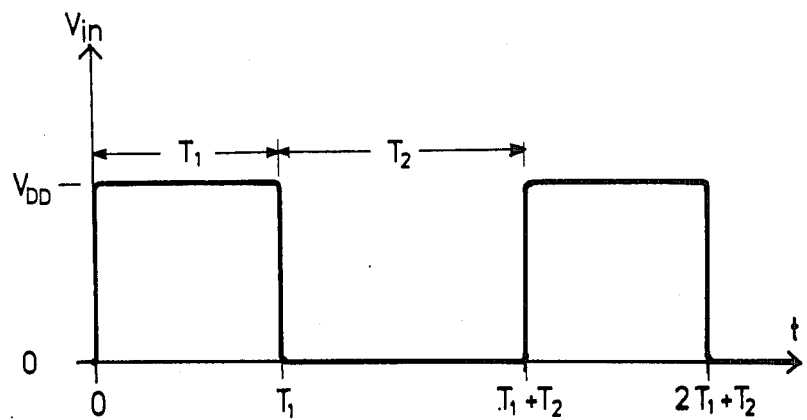
FIG. 2 is a graphical representation of the voltage $V_{in}$ waveform present in FIG. 1.

The frequency signal obtained from the output terminal c of the oscillator 10 is intended to be sufficiently high so as to minimize the effect of possible leakage resistances. The frequency signal is conducted to a frequency divider 11, which is an asynchronous or synchronous divider, having a division ratio N, which is preferably higher than ten. The frequency divider 11 has an output terminal d at which an output voltage signal $V_{in}$ is provided. The square wave voltage waveform of $V_{in}$ is shown in FIG. 2, and is further described below.

An esential feature of this invention is the alternate connection of the unknown capacitance $C_M$ to be measured and the reference capacitance $C_R$ to the measurement oscillator 10 for an equal number of cycles of the output voltage $V_{in}$. This is accomplished by dividing the frequency f of the oscillator 10 by the frequency divider 11 and by controlling switches $K_1$ and $K_2$ via the square wave output voltage $V_{in}$ at the output d of the divider 11 and an inverter 12. The switches $K_1$ and $K_2$ are analog switches, illustrated by blocks 13a and 13b in FIG. 1. The switches $K_1$ and $K_2$ operate alternately, so that when the switch $K_1$ is closed, the switch $K_2$ is open, and vice versa.

In FIG. 1, the output voltage $V_{in}$ of the frequency divider 11 also controls the data-out buffers 15a and 15b, having respective operating voltage terminals which have been brought out separately and which are commonly joined at a control terminal e. The amplitudes of the square wave voltages supplied by the data-out buffers 15a and 15b have been designated as $V_{in}'$ and $V_{in}''$, respectively. The voltages $V_{in}'$ and $V_{in}''$ may be adjusted in amplitude by adjusting the amplitude of a control voltage $V_1$ at control terminal e for the purpose of providing linearization, compensation and scaling, as hereinafter described in greater detail in connection with the description of the embodiment shown in FIGS. 3, 4 and 5.

The information on, i.e. the value of, the capacitance $C_M$ to be measured is contained in the half-cycle times $T_1$ and $T_2$ of the square wave output voltage $V_{in}$ generated by the frequency divider 11. Since each half-cycle time is inversely proportional to the frequency signal f [see Equation (2) above], it can be shown that:

$$T_1 = \frac{N(B(C_o + C_R) + \tau)}{A} \tag{3}$$

and $$T_2 = \frac{N(B(C_o + C_M) + \tau)}{A} \tag{4}$$

It is also convenient to define the ratio of each half-cycle time relative to the entire time of each cycle. These so-called pulse ratios $X_1$ or $X_2$ are defined by the following equations:

$$X_1 = \frac{T_1}{T_1 + T_2} \tag{5}$$

and $$X_2 = \frac{T_2}{T_1 + T_2} \tag{6}$$

As was already stated above, the capacitance $C_M$ to be measured and the reference capacitance $C_R$ are alternately connected to the measurement oscillator 10 for an equal number of cycles, the number of cycles being advantageously equal to the division ratio N of the frequency divider 11. Thus, the switching times $T_1$ and $T_2$ are proportional to the number of cycles N and to the connected capacitance $C_{IN}$. Under these circumstances, the half-cycle time intervals $T_1$ and $T_2$ of the output voltage $V_{in}$ are determined by the division ratio N and the capacitances $C_R$ and $C_M$, respectively. The pulse ratios $X_1$ and $X_2$ are proportional to the magnitude of the capacitance $C_M$ to be measured and connected to the oscillator 10. The durations of the half-cycle times $T_1$ and $T_2$ are direct linear functions of the value of the capacitances $C_R$ and $C_M$, respectively.

In accordance with the invention, means are provided for generating an output DC voltage proportional, preferably in a direct linear relationship, to the capacitance $C_M$ to be measured at output terminal $g_1$ alone, or at output terminals $g_1$ and $g_2$, of a rectifier-filter sub-circuit 16. The output voltage is preferably linearized, temperature-compensated and scaled, as described below. The output voltage may be conducted to an indicator meter 100 connected across output terminals $g_1$ and $g_2$. The meter is preferably a voltmeter having a scale calibrated to directly indicate the value of the capacitance being measured.

The sub-circuit 16 may have a single stage comprising buffer 15a which includes transistors $M_1$ and $M_2$, and a low-pass filter which includes resistor $R_1$ and capacitor $C_1$. Alternatively, the sub-circuit 16 may have two stages, as shown, comprising inverter 14; a buffer 15b which includes transistors $M_3$ and $M_4$; and a low-pass filter which includes resistor $R_2$ and capacitor $C_2$. The output voltages generated by buffers 15a and 15b have been designated $V_{in}'$ and $V_{in}''$, respectively. Once the output voltages $V_{in}'$ and $V_{in}''$ have been conducted through their respective low-pass filters, the output voltages have been designated $V_{o1}$ and $V_{o2}$, respectively, at output terminals $g_1$ and $g_2$.

With a single stage design, it can be shown that:

$$V_{o1} = X_2 \cdot V_1 \tag{7}$$

wherein $X_2$ is the pulse ratio defined above in Equation (6), and $V_1$ is the above-described control voltage at control terminal e.

It has been assumed for the sake of simplicity that $R_1=R_2$ and $C_1=C_2$ and each low-pass filter has a time constant: $R_1 \cdot C_1 >> T_1 + T_2$.

Correspondingly, with the same assumptions in a two stage design, it can be shown that:

$$V_{o2} = X_1 \cdot V_1 \tag{8}$$

wherein $X_1$ is the pulse ratio defined above in Equation (5), and $V_1$ is the above-described control voltage.

The differential voltage $V_{o1}-V_{o2}$, i.e. the output voltage in the two-stage design, is:

$$V_{o1} - V_{o2} = (X_2 - X_1) \cdot V_1 = \frac{T_2 - T_1}{T_1 + T_2} \cdot V_1 \tag{9}$$

By varying the voltage $V_1$ to be supplied through the control terminal e to the sub-circuit 16, the amplitude of the differential output voltage as defined in Equation (9) is adjusted, thereby providing a convenient means for compensating, linearizing and scaling the output voltage. The value of the capacitance $C_M$ may be conveniently read off the meter 100 to which the differential output voltage is conducted.

The output voltage $V_{o1}$ (single stage) or $V_{o1}-V_{o2}$ (two stage) may be compensated with respect to a desired parameter, for example, the temperature, by providing the voltage $V_1$ as a feedback voltage and by making the feedback voltage dependent upon the parameter to be compensated, in a suitable manner.

Linearization is obtained by feeding an attenuated and inverted portion of the output voltage back to the control terminal e as a feedback voltage. The buffers 15a or 15b function as non-linear components. As described below, the resulting linearized output voltage is dependent upon the pulse ratios $X_1$ and $X_2$ and the magnitude of a regulating voltage V.

Scaling is obtained by adjusting the magnitude of the control voltage $V_1$ so that the range of variation of the output voltage, constituting the output variable dependent upon the capacitance $C_M$ to be measured, that is, the scale, may be set for a suitable range.

A more detailed exemplifying embodiment of the linearization, temperature compensation and scaling of the output voltage used in the method of the invention is hereinafter described with reference to FIGS. 3, 4 and 5.

In FIG. 3, the output terminals $g_1$ and $g_2$ of sub-circuit 16 are respectively connected through resistors $R_5$ and $R_7$ respectively to the negative and positive inputs of an amplifier 17' of a differential operational amplifier sub-circuit 17. Resistors $R_3$ and $R_4$ are connected in series across the output terminals $g_1$ and $g_2$. Resistor $R_8$ connects the positive input of amplifier 17' to ground. Resistor $R_6$ connects the negative input of amplifier 17' to an output terminal h. For the sake of simplicity, it will be assumed that $R_6=R_8$, that $R_5=R_7$, and that the amplifier 17' has a gain $G=-R_6/R_5$. An output voltage $V_o$ is produced at output terminal h and, as shown, this output DC voltage is conducted to voltmeter 100 which indicates the corresponding value of capacitance being measured.

The output voltage $V_o$ at terminal h is also conducted through resistor $R_{11}$ to the negative input of summing amplifier 18' of a summing operational amplifier sub-circuit 18. An adjustable regulating voltage V of negative value is conducted through resistor $R_9$ to the same negative input of summing amplifier 18'. Resistor $R_{10}$ is connected between the negative input and the output j of the amplifier. The positive input of amplifier 18' is grounded. The sub-circuit 18 is operative for combining the regulating voltage V and the output voltage $V_o$ to generate a feedback voltage $V_2$ at the output terminal j. The voltage $V_2$ is conducted along a feedback loop 20 back to control terminal e, whereat the feedback voltage $V_2$ now constitutes the aforementioned control voltage $V_1$.

The various voltage waveforms $V_{in}$, $V_{in}'$ and $V_{in}''$ appearing at different points in FIG. 3 are shown in FIG. 4.

The differential output voltage $(V_{o1}-V_{o2})$, as defined above, is:

$$V_{o1} - V_{o2} = (X_2 - X_1) \cdot V_1 \tag{10}$$

It can then be deduced that the following equations are applicable:

$$V_0 = G \cdot (X_2 - X_1) \cdot V_1 \tag{11}$$

$$V_2 = -V_o \cdot k_2 - V k_1 \tag{12}$$

$$V_2 = -G \cdot (X_2 - X_1) \cdot (V_1 \cdot k_2) - (k_1 \cdot V) \tag{13}$$

It will now be assumed that $V_2 = V_1$. The terms $k_1$ and $k_2$ are defined as follows:

$$k_1 = R_{10}/R_9 \tag{14}$$

$$k_2 = R_{10}/R_{11} \tag{15}$$

Substituting these values in Equation (13), $$V_1 = \frac{-k_1 \cdot V}{1 + G(X_2 - X_1) \cdot k_2} \tag{17}$$

Substituting these values in Equation (11), the following equation for the output voltage is obtained:

$$V_o = -\frac{G \cdot k_1 \cdot V(X_2 - X_1)}{1 + G \cdot (X_2 - X_1) \cdot k_2} \quad (18)$$

In equation (18), changing the sign of the gain G of the amplifier 17' permits the changing of the direction of curvature of the characteristic curve of the output voltage. Also, adjustment of the term $k_2$ in Equation (18) permits adjustment of the magnitude of the curvature.

Of course, as previously stated, changing the value of the regulating voltage V changes the magnitude of the output voltage $V_o$, and can be used for temperature compensation, scaling and linearization. The characteristic curve of the output voltage, be it the output voltage $V_{o1}$ alone, the differential output voltage $V_{o1} - V_{o2}$, or the output voltage $V_o$, is best shown in FIG. 5, wherein the absolute value of the differential output voltage is plotted as a function of the capacitance $C_M$. The FIG. 5 curve intersects the abscissa at $C_M = C_R$ and increases at a constant linear slope until the maximum value of $C_{M\,max}$ is achieved.

The operation of the FIG. 3 circuit can be briefly summarized as follows: The voltage $V_{in}$ shown in FIG. 2 and FIG. 4 at the output of the divider 11 is conducted directly to buffer 15a, whereupon the voltage $V_{in}'$ (see FIG. 4) is generated and conveyed through a low-pass filter, thereupon generating voltage $V_{o1}$ (see Equation 7) at output $g_1$. The voltage $V_{in}$ is also conducted through inverter 14 and then to buffer 15b, whereupon the voltage $V_{in}''$ (see FIG. 4) is generated and conveyed through a low-pass filter, thereupon generating voltage $V_{o2}$ (see Equation 8) at output $g_2$. Differential voltage $V_{o1} - V_{o2}$ (see Equation 9) is conducted to resistors $R_5$ and $R_7$, respectively, to the negative and positive inputs of differential amplifier 17', the latter being biased by positive biasing voltage $V_{DD}$ and negative biasing voltage $V_{SS}$, thereby generating the output signal $V_o$. This output signal, now simply called the output voltage $V_o$, is conveyed directly to a high input impedance voltmeter 100 for a convenient, direct read out of the capacitance $C_M$ which, it will be remembered, is proportional to the half-cycle times $T_1$ and $T_2$ as well as the magnitude of the control voltage $V_1$. The control voltage $V_1$ may be fixed or adjustable in magnitude, and may be supplied from either a separate voltage supply, or be fed back as a feedback voltage.

Hence, in accordance with this latter aim, the output voltage $V_o$ is conducted through resistor $R_{11}$ to the negative input of summing amplifier 18' which is biased by positive biasing voltage $V_{DD}$ and negative biasing voltage $V_{SS}$. A negative regulating voltage, which may range typically from 0 to $-5$ volts, is conducted through resistor $R_9$ to the same negative input, whereupon the output and regulating voltages are summed and inverted by amplifier 18' to form the positive feedback voltage $V_2$ (see Equation 12). This feedback voltage $V_2$ is conducted along loop 20 to terminal e to constitute the control voltage. Equation 18 shows the relationship between the output voltage $V_o$ and the regulating voltage V. As is also clear from Equation 18, the condition for stability is:

$$|G \cdot (X_2 - X_1) \cdot k_2| << 1 \quad (19)$$

In a purely non-limiting exemplary embodiment, the gain G of amplifier 17' is chosen to be $-5$. The regulating voltage is $-5$ volts. The values of $R_{10}$ and $R_{11}$ are selected such that $k_2 = 0.2$. The values of $R_{10}$ and $R_9$ are selected such that $k_1 = 0.8$. The differential pulse ratio $(X_2 - X_1)$ will, of course, vary depending, inter alia, on the value of the capacitance $C_M$ to be measured, and as tabulated in TABLE I may vary from 0 to 0.1, in which case, the differential output voltage $(V_{o1} - V_{o2})$, the feedback voltage $(V_2)$ and the output voltage $(V_o)$ read by voltmeter 100 are, as calculated by above equations:

TABLE I

| $X_2 - X_1$ | $V_{o1} - V_{o2}$ | $V_2$(volts) | $V_o$(volts) |
|---|---|---|---|
| 0 | 0 | 4 | 0 |
| 0.01 | 0.0404 | 4.0404 | −0.202 |
| 0.03 | 0.1237 | 4.1237 | −0.6186 |
| 0.05 | 0.2105 | 4.2105 | −1.0526 |
| 0.07 | 0.3011 | 4.3011 | −1.5054 |
| 0.1 | 0.4444 | 4.4444 | −2.2222 |

The output voltage $V_o$ as tabulated in TABLE I and as defined by Equation 18 is plotted in FIG. 5. The factor $k_2$ in the denominator of Equation 18 determines the magnitude of the linearity correction. If $R_{11}$ is infinite ($k_2 = 0$), then there is no correction of linearity. If $R_{11}$ approaches zero, $k_2$ approaches infinity, and the feedback voltage $V_2$ approaches zero, in which case, the feedback circuit does not function. Hence, to control the linearization of the output voltage $V_o$, one can adjust the value of resistor $R_{11}$, and this is represented in FIG. 3 by an arrow drawn through $R_{11}$.

Turning now to the subject of temperature compensation in more detail, the constants A and B in Equations 2, 3 and 4 vary in relation to the temperature, the operating voltage, time, etc. The constant $\tau$ also depends on temperature and is mainly caused by the delay of the Schmitt trigger 9. Such variables contribute to zero and sensitivity shifting and, of course, measurement errors. It will be noted from Equation 9, when the Equations 3 and 4 are substituted therein, that:

$$V_{o1} - V_{o2} = \frac{T_2 - T_1}{T_1 - T_2} \cdot V_1 = \frac{C_M - C_R}{2C_O + C_M + C_R + (2\tau/B)} \cdot V_1 \quad (20)$$

The term $(2\tau/B)$ typically represents about 10% of the denominator of Equation 20, and its temperature dependence varies about $+0.5\%$ per degree Centigrade. This temperature dependence attempts to alter the slope of the curve in FIG. 5 at high operating frequencies.

Similarly, the term $(2C_O)$ typically represents about 25% of the denominator of Equation 20, and its temperature dependence varies about $-0.2\%$ per degree Centigrade.

Thus, by careful selection of the temperature coefficient of the capacitance $C_o$, it is possible to partly compensate for the temperature dependence of the term $(2\tau/B)$, particularly at high operating frequencies.

Another way of compensating for temperature is to make the resistor $R_9$ dependent on temperature, e.g. by constituting the resistor $R_9$ as a pair of series-connected resistors, one being a metal film resistor, the other a negative temperature coefficient (NTC) resistor. This is schematically represented by an arrow drawn through resistor $R_9$. It will be recalled from Equation 14 that the term $k_1$ is inversely proportional to the value of resistor $R_9$, and from Equation 18 that the output voltage $V_o$ is directly proportional to $k_1$. In practice, the output voltage $V_o$ has a temperature sensitivity of about $-0.05\%$ per degree Centigrade. By selecting a negative temperature coefficient for the resistor $R_9$, the term $k_1$ will have a positive temperature coefficient, preferably on the order of $+0.05\%$ per degree Centigrade, thereby compensating for temperature sensitivity.

In the above situation, $R_9$ can be selected to satisfy the following equation:

$$R_9 = R_O + D \cdot t_p \quad (21)$$

wherein $R_O = R_9$ when $t_p = 0°$ C., $t_p$ is the temperature in degrees Centigrade, and $D$ is the resistance variation per degree Centigrade.

Hence, Equation (18) can be rewritten as:

$$V_o = \frac{-G \cdot \frac{R_{10}}{R_O + D \cdot t_p} \cdot (X_2 - X_1) \cdot V}{1 + G \cdot (X_2 - X_1) \cdot k_2} \quad (22)$$

It can easily be observed that varying the resistance of $R_9$ will affect the output voltage and compensate for temperature sensitivity.

Rather than varying $R_9$ with temperature, as mentioned previously, the negative regulating voltage $V$ can be varied with temperature and compensate for temperature sensitivity of the output voltage $V_o$.

It will be understood that each of the elements described above, or two or more together, also may find a useful application in other types of constructions differing from the types described above.

While the invention has been illustrated and described as embodied in a method of and arrangement for measuring low capacitances, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

I claim:

1. A method of measuring low capacitances, comprising the steps of:
   (a) operating one frequency generator operative for generating a periodic frequency signal having time periods of duration dependent on capacitance;
   (b) alternately connecting an unknown capacitance to be measured and a known reference capacitance, one after the other, to the frequency generator for an equal number of time periods, thereby causing each time period of the frequency signal to have a first time interval proportional to the reference capacitance, and a second time interval proportional to the capacitance being measured; and
   (c) generating, in response to the durations of said first and second time intervals, a differential DC voltage output signal directly proportional to the difference between the capacitance being measured and the reference capacitance.

2. The method as recited in claim 1; and further comprising the steps of providing inlet terminals on the generator; and wherein the connecting step includes alternately switching the unkown and known capacitances to the inlet terminals.

3. The method as recited in claim 2; and further comprising determining the number of times that the unknown and known capacitances are switched to the generator, including providing a frequency divider having a division ratio, said number of times corresponding to said division ratio.

4. The method as recited in claim 1, wherein the generating step includes the step of filtering the frequency signal composed of first and second time intervals to generate the differential DC voltage output signal.

5. The method as recited in claim 4, wherein the generating step includes the step of controlling the amplitude of the frequency signal.

6. The method as recited in claim 5, wherein the controlling step includes providing a control component having a control terminal, and applying an adjustable control voltage to the control terminal.

7. The method as recited in claim 6, wherein the applying step includes feeding a part of the differential DC voltage output signal back to the control terminal.

8. The method as recited in claim 7, wherein the feeding step includes providing an adjustable regulatable component, and applying an adjustable regulating voltage to the regulatable component.

9. The method as recited in claim 8, wherein the step of applying the regulating voltage includes adjusting the same to linearize the differential DC voltage output signal.

10. The method as recited in claim 8, wherein the step of applying the regulating voltage includes adjusting the same to scale the differential DC voltage output signal within a predetermined range.

11. The method as recited in claim 1; and further comprising the steps of providing a temperature compensatable component, and adjusting the same to compensate for temperature variations.

12. The method as recited in claim 1; and further comprising indicating the value of the capacitance being measured as a function of the DC voltage output signal.

13. An arrangement for measuring low capacitances, comprising:
   (a) one frequency generator means operative for generating a periodic frequency signal having time periods of duration dependent on capacitance;
   (b) means for alternately connecting an unknown capacitance to be measured and a known reference capacitance, one after the other, to the frequency generator means for an equal number of time periods, thereby causing each time period of the frequency signal to have a first time interval proportional to the reference capacitance, and a second time interval proportional to the capacitance being measured; and
   (c) means for generating, in response to the durations of said first and second time intervals, a differential DC voltage output signal directly proportional to the difference between the capacitance being measured and the reference capacitance.

14. The arrangement as recited in claim 13; and further comprising inlet terminals on the generator means; and wherein the connecting means includes means for alternately switching the unknown and known capacitances to the inlet terminals.

15. The arrangement as recited in claim 14; and further comprising means for determining the number of times that the unknown and known capacitances are switched to the generator means, including a frequency divider having a division ratio, said number of times corresponding to said division ratio.

16. The arrangement as recited in claim 13; and further comprising means for filtering the frequency signal composed of first and second time intervals to generate the differential DC voltage output signal.

17. The arrangement as recited in claim 16; and further comprising means for controlling the amplitude of the frequency signal.

18. The arrangement as recited in claim 17, wherein the controlling means includes a control component having a control terminal, and means for applying an adjustable control voltage to the control terminal.

19. The arrangement as recited in claim 18, wherein the applying means includes means for feeding a part of the differential DC voltage output signal back to the control terminal.

20. The arrangement as recited in claim 19, wherein the feeding means includes an adjustable regulatable component, and means for applying an adjustable regulating voltage to the regulatable component.

21. The arrangement as recited in claim 20, wherein the means for applying the regulating voltage includes means for adjusting the same to linearize the DC voltage output signal.

22. The arrangement as recited in claim 20, wherein the means for applying the regulating voltage includes means for adjusting the same to scale the differential DC voltage output signal within a predetermined range.

23. The arrangement as recited in claim 13; and further comprising a temperature compensatable component, and means for adjusting the same to compensate for temperature variations.

24. The arrangement as recited in claim 13; and further comprising means for indicating the value of the capacitance being measured as a function of the differential DC voltage output signal.

* * * * *